(12) United States Patent
Loy et al.

(10) Patent No.: US 12,363,892 B2
(45) Date of Patent: Jul. 15, 2025

(54) NON-VOLATILE MEMORY ELEMENTS WITH ONE-TIME OR MULTIPLE-TIME PROGRAMMABILITY

(71) Applicant: GlobalFoundries Singapore Pte. Ltd., Singapore (SG)

(72) Inventors: Desmond Jia Jun Loy, Singapore (SG); Eng Huat Toh, Singapore (SG); Sriram Balasubramanian, Singapore (SG); Shyue Seng Tan, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 402 days.

(21) Appl. No.: 17/580,812

(22) Filed: Jan. 21, 2022

(65) Prior Publication Data
US 2022/0149051 A1    May 12, 2022

Related U.S. Application Data

(62) Division of application No. 16/700,430, filed on Dec. 2, 2019, now Pat. No. 11,302,702.

(51) Int. Cl.
| | |
|---|---|
| *H10B 20/00* | (2023.01) |
| *H01L 23/525* | (2006.01) |
| *H10B 20/20* | (2023.01) |
| *H10B 20/25* | (2023.01) |

(52) U.S. Cl.
CPC ............ *H10B 20/00* (2023.02); *H10B 20/20* (2023.02); *H10B 20/25* (2023.02); *H01L 23/5252* (2013.01)

(58) Field of Classification Search
CPC ...... H10B 20/00; H10B 20/20; H01L 23/5252
See application file for complete search history.

(56) References Cited

U.S. PATENT DOCUMENTS

| | | | |
|---|---|---|---|
| 7,423,903 B2 | 9/2008 | Lin et al. | |
| 8,320,180 B2 | 11/2012 | Kalnitsky et al. | |
| 2002/0190306 A1* | 12/2002 | Sasago | H10B 41/30 257/315 |
| 2008/0179692 A1 | 7/2008 | Chun et al. | |

(Continued)

OTHER PUBLICATIONS

H. W. Pan et al., "1Kbit FinFET Dielectric (FIND) RRAM in pure 16nm FinFET CMOS logic process," 2015 IEEE International Electron Devices Meeting (IEDM), Washington, DC, 2015, pp. 10.5.1-10.5.4.

(Continued)

*Primary Examiner* — Aaron J Gray
(74) *Attorney, Agent, or Firm* — Thompson Hine LLP

(57) ABSTRACT

Structures for a non-volatile memory and methods of forming such structures. A gate electrode and a gate dielectric layer are formed over an active region with the gate dielectric layer between the gate electrode and the active region. A first doped region is formed in the active region, a second doped region is formed in the active region, and a source line is coupled to the second doped region. The first doped region is positioned in the active region at least in part beneath the gate dielectric layer, and the second doped region is positioned in the active region adjacent to the first doped region. The first doped region has a first conductivity type, and the second doped region has a second conductivity type opposite to the first conductivity type.

20 Claims, 5 Drawing Sheets

(56) References Cited

U.S. PATENT DOCUMENTS

| | | |
|---|---|---|
| 2010/0039868 A1 | 2/2010 | Mitchell et al. |
| 2011/0108926 A1* | 5/2011 | Bahl .................. H10B 20/25 |
| | | 257/E27.014 |
| 2016/0240644 A1 | 8/2016 | Muller et al. |

OTHER PUBLICATIONS

Peng et al., "A New High Density FinFET OTP Technology", Extended Abstracts of the 2015 International Conference on Solid State Devices and Materials, Sapporo, Japan, 2015, pp. 1192-1193.
Ememory, "NeoMTP®—Cost-Effective MTP solution", Product Brochure Mar. 2019.

\* cited by examiner

NON-VOLATILE MEMORY ELEMENTS WITH ONE-TIME OR MULTIPLE-TIME PROGRAMMABILITY

BACKGROUND

The present invention relates to integrated circuits and semiconductor device fabrication and, more specifically, to structures for a non-volatile memory and methods of forming such structures.

Non-volatile memories are utilized in various electronic products, such as cellular telephones. One-Time-Programmable (OTP) memory and Multiple-Time-Programmable (MTP) memory are common types of non-volatile memories. A major difference between these types of non-volatile memories is that an MTP memory is capable of being repeatedly programmed and erased in contrast to an OTP memory that can only be programmed a single time. A general disadvantage of conventional OTP memories and MTP memories is their relatively-large device size.

Improved structures for a non-volatile memory and methods of forming such structures are needed.

SUMMARY

According to an embodiment of the invention, a structure for a non-volatile memory element is provided. The structure includes an active region, a gate electrode over the active region, a gate dielectric layer between the gate electrode and the active region, a first doped region in the active region, a second doped region in the active region, and a source line coupled to the second doped region. The first doped region is positioned in the active region at least in part beneath the gate dielectric layer, and the second doped region is positioned in the active region adjacent to the first doped region. The first doped region has a first conductivity type, and the second doped region has a second conductivity type opposite to the first conductivity type.

According to another embodiment of the invention, a method of forming a structure for a non-volatile memory element is provided. The method includes forming a gate dielectric layer over an active region, form a gate electrode over the gate dielectric layer, forming a first doped region in the active region that is positioned at least in part beneath the gate dielectric layer, forming a second doped region in the active region that is positioned adjacent to the first doped region, and forming a source line coupled to the second doped region. The first doped region has a first conductivity type, and the second doped region has a second conductivity type opposite to the first conductivity type.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
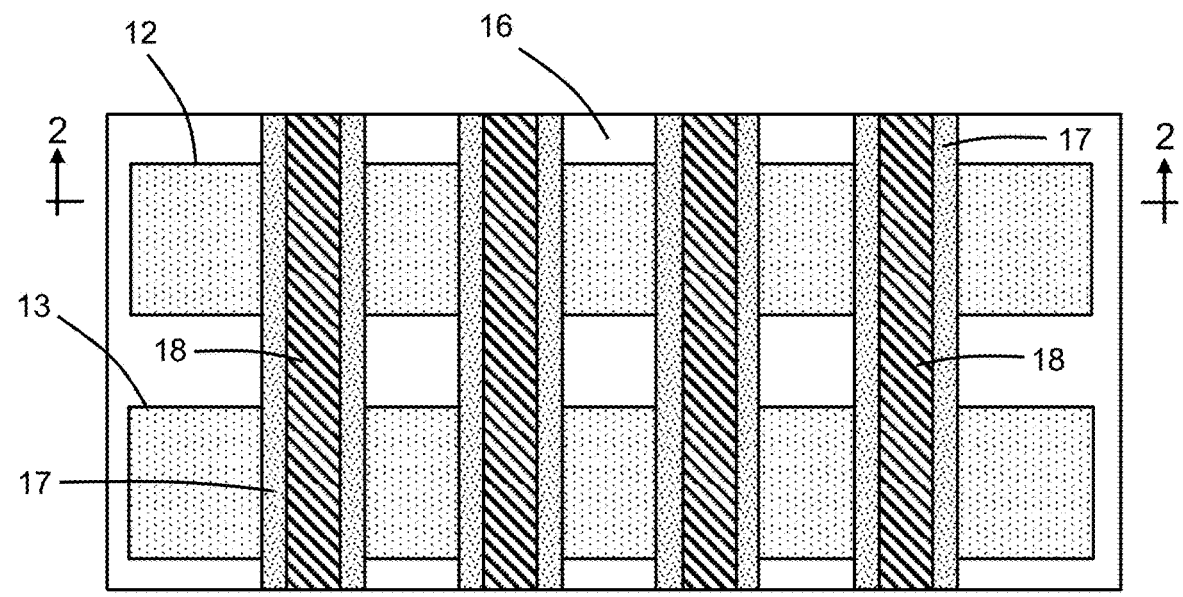
FIG. 1 is a top view of a non-volatile memory structure at an initial fabrication stage of a processing method in accordance with embodiments of the invention.
Figure 2:
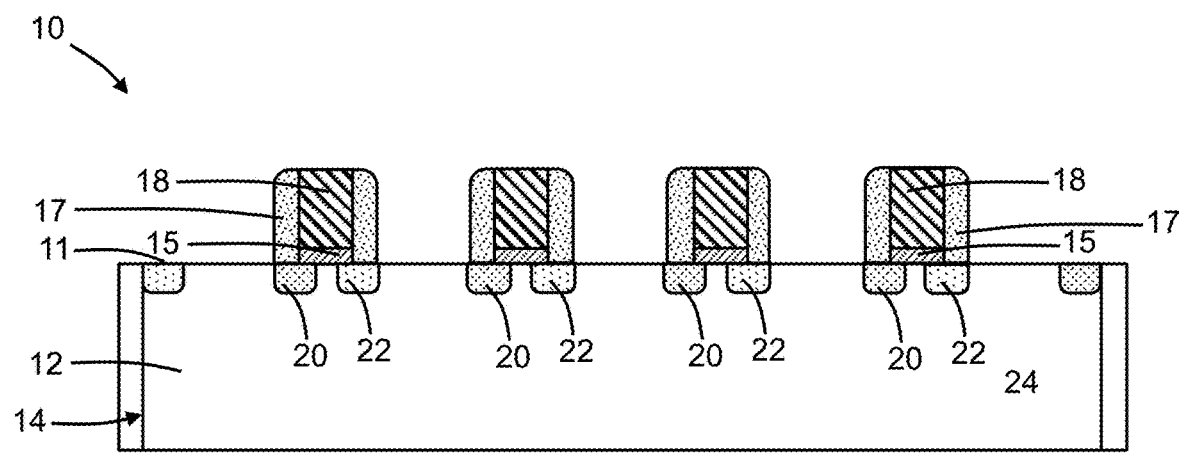
FIG. 2 is a cross-sectional view taken generally along line 2-2 in FIG. 1.

With reference to FIGS. 1, 2 and in accordance with embodiments of the invention, a structure 10 for a non-volatile memory includes active regions 12, 13 defined in a substrate 14 by shallow trench isolation regions 16, gate electrodes 18, and doped regions 20, 22 formed in the active regions 12, 13 of the substrate 14. The substrate 14 may be composed of a monocrystalline or single-crystal semiconductor material, such as single-crystal silicon, and may be a bulk wafer composed of single-crystal semiconductor material (e.g., single-crystal silicon). The shallow trench isolation regions 16 are formed in trenches that extend from a top surface of the substrate 14 to a shallow depth into the substrate 14. The shallow trench isolation regions 16 may be composed of a dielectric material, such as silicon dioxide, deposited by chemical vapor deposition into trenches patterned by lithography and etching processes in the substrate 14 and then planarized. The shallow trench isolation regions 16 surround each of the active regions 12, 13. The semiconductor material of the active regions 12, 13 may be doped with a dopant, such as an n-type dopant, to form a well. The well may be formed by, for example, ion implantation.

The gate electrodes 18 extend along respective longitudinal axes over and across a top surface 11 of the active regions 12, 13 and shallow trench isolation regions 16. The gate electrodes 18 may be composed of heavily-doped polysilicon that is deposited as a layer over the substrate 14 and patterned with lithography and etching processes. The gate electrodes 18 have a spaced-apart arrangement with a given pitch. A gate dielectric layer 15 may be arranged between the active regions 12, 13 and the gate electrodes 18. In an embodiment, the gate dielectric layer 15 may be composed of silicon dioxide. In an embodiment, the gate dielectric layer 15 may be composed of a high-k dielectric material, such as hafnium oxide or tantalum oxide, having a dielectric constant greater than or equal to four (4).

Sidewall spacers 17 may be positioned adjacent to the gate electrodes 18. The sidewall spacers 17 may be composed of a dielectric material that is deposited by a conformal deposition process, such as silicon dioxide or silicon nitride deposited by atomic layer deposition, and then etched with an anisotropic etching process, such as reactive ion etching.

The doped regions 20, 22 may be located in each active region 12, 13 in part beneath the gate dielectric layer 15 under each of the gate electrodes 18 and in part beneath the sidewall spacers 17. The doped regions 20, 22 are positioned beneath the top surface 11 of the respective active regions 12, 13. The doped regions 20 have an opposite conductivity type from the doped regions 22. In an embodiment, the semiconductor material of the doped regions 20 may be doped with an n-type dopant (e.g., phosphorus and/or arsenic) that provides n-type conductivity. In an embodiment, the semiconductor material of the doped regions 22 may be doped with a p-type dopant (e.g., boron) that provides p-type conductivity. In an embodiment, the doped regions 20 may contain a dopant concentration in a range equal to about $1\times10^{17}$ atoms/cm$^3$ to about $5\times10^{18}$ atoms/cm$^3$. In an embodiment, the doped regions 22 may contain a dopant concentration in a range equal to about $1\times10^{17}$ atoms/cm$^3$ to about $5\times10^{18}$ atoms/cm$^3$. The doped regions 20 may have the same conductivity type as the well formed in the active regions 12, 13, and the doped regions 22 may have an opposite conductivity type from the well.

The doped regions 20 may be formed by, for example, ion implantation with an implantation mask covering masked areas of the active regions 12, 13 and exposing intended unmasked locations for the doped regions 20. The implantation mask may include a layer of a light-sensitive material, such as a photoresist, applied by a spin-coating process, pre-baked, exposed to light projected through a photomask, baked after exposure, and developed with a chemical developer. The implantation conditions (e.g., ion species, dose, kinetic energy) may be selected to tune the electrical and physical characteristics (e.g., electrical resistivity and depth profile) of the doped regions 20. In an embodiment, the doped regions 20 may be implanted with an n-type dopant (e.g., phosphorus and/or arsenic) that provides n-type conductivity. The implantation mask may be stripped after forming the doped regions 20.

Similarly, the doped regions 22 may be formed by, for example, ion implantation with an implantation mask covering masked areas of the active regions 12, 13 and exposing intended unmasked locations for the doped regions 22. The implantation mask may include a layer of a light-sensitive material, such as a photoresist, applied by a spin-coating process, pre-baked, exposed to light projected through a photomask, baked after exposure, and developed with a chemical developer. The implantation conditions (e.g., ion species, dose, kinetic energy) may be selected to tune the electrical and physical characteristics (e.g., electrical resistivity and depth profile) of the doped regions 22. In an embodiment, the doped regions 22 may be implanted with a p-type dopant (e.g., boron) that provides p-type conductivity. The implantation mask may be stripped after forming the doped regions 22.

With regard to size of the structure 10, the number of gate electrodes 18 and the number of active regions 12, 13 may each be greater than the representative number shown in FIGS. 1, 2. Each of the individual active regions 12, 13 may define a memory element or bitcell of a non-volatile memory.

Figure 3:
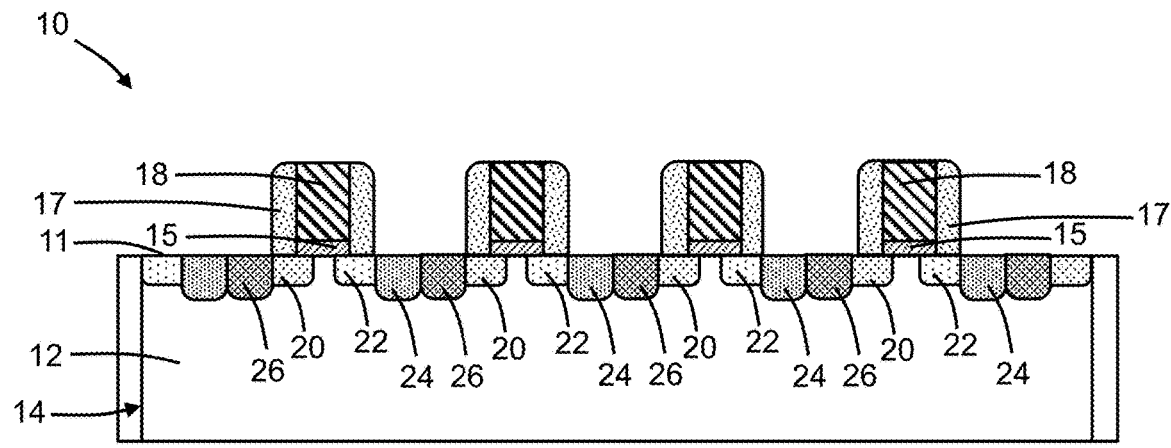
FIGS. 3 and 4 are cross-sectional views of the non-volatile memory structure at successive fabrication stages of the processing method subsequent to FIG. 2.

With reference to FIG. 3 in which like reference numerals refer to like features in FIG. 2 and at a subsequent fabrication stage of the processing method, the structure 10 further includes doped regions 24, 26 that are formed in the active regions 12, 13 of the substrate 14.

The doped regions 24, 26 may be positioned in each active region 12, 13 laterally between the gate electrodes 18 and below the top surface 11. The doped regions 24, 26 may extend to a greater depth relative to the top surface 11 than the doped regions 20, 22. Pairs of the doped regions 24, 26 are positioned between one of the doped regions 20 and its nearest doped region 22.

The doped regions 24 have an opposite conductivity type from the doped regions 26, the doped regions 24 have an opposite conductivity type from the doped regions 22, and the doped regions 26 have an opposite conductivity type from the doped regions 20. In an embodiment, the semiconductor material of the doped regions 24 may be doped with an n-type dopant (e.g., phosphorus and/or arsenic) that provides n-type conductivity. In an embodiment, the semiconductor material of the doped regions 26 may be doped with a p-type dopant (e.g., boron) that provides p-type conductivity. The doped regions 24 abut the doped regions 26 to define respective p-n junctions across which the conductivity type changes, the doped regions 26 abut the doped regions 20 to define respective p-n junctions, and the doped regions 24 abut the doped regions 22 to define respective p-n junctions.

The doped regions 24 are more heavily doped (i.e., contain a higher dopant concentration) than the doped regions 20. The doped regions 26 are more heavily doped (i.e., contain a higher dopant concentration) than the doped regions 22. In an embodiment, the doped regions 24 may be heavily doped with n-type dopant to contain a dopant concentration in a range equal to about $5\times10^{18}$ atoms/cm$^3$ to about $1\times10^{20}$ atoms/cm$^3$. In an embodiment, the doped regions 26 may be heavily doped with p-type dopant to contain a dopant concentration in a range equal to about $5\times10^{18}$ atoms/cm$^3$ to about $1\times10^{20}$ atoms/cm$^3$. The doped regions 24 may have the same conductivity type as the well formed in the active regions 12, 13, and the doped regions 26 may have the opposite conductivity type from the well formed in the active regions 12, 13.

The doped regions 24 may be formed by, for example, ion implantation with an implantation mask covering masked areas of the active regions 12, 13 and exposing intended unmasked locations for the doped regions 24. The implantation mask may include a layer of a light-sensitive material, such as a photoresist, applied by a spin-coating process, pre-baked, exposed to light projected through a photomask, baked after exposure, and developed with a chemical developer. The implantation conditions (e.g., ion species, dose, kinetic energy) may be selected to tune the electrical and physical characteristics (e.g., electrical resistivity and depth profile) of the doped regions 24. The implantation mask may be stripped after forming the doped regions 24.

Similarly, the doped regions 26 may be formed by, for example, ion implantation with an implantation mask covering masked areas of the active regions 12, 13 and exposing intended unmasked locations for the doped regions 26. The implantation mask may include a layer of a light-sensitive material, such as a photoresist, applied by a spin-coating process, pre-baked, exposed to light projected through a photomask, baked after exposure, and developed with a chemical developer. The implantation conditions (e.g., ion species, dose, kinetic energy) may be selected to tune the electrical and physical characteristics (e.g., electrical resistivity and depth profile) of the doped regions 26. The implantation mask may be stripped after forming the doped regions 26.

Figure 4:
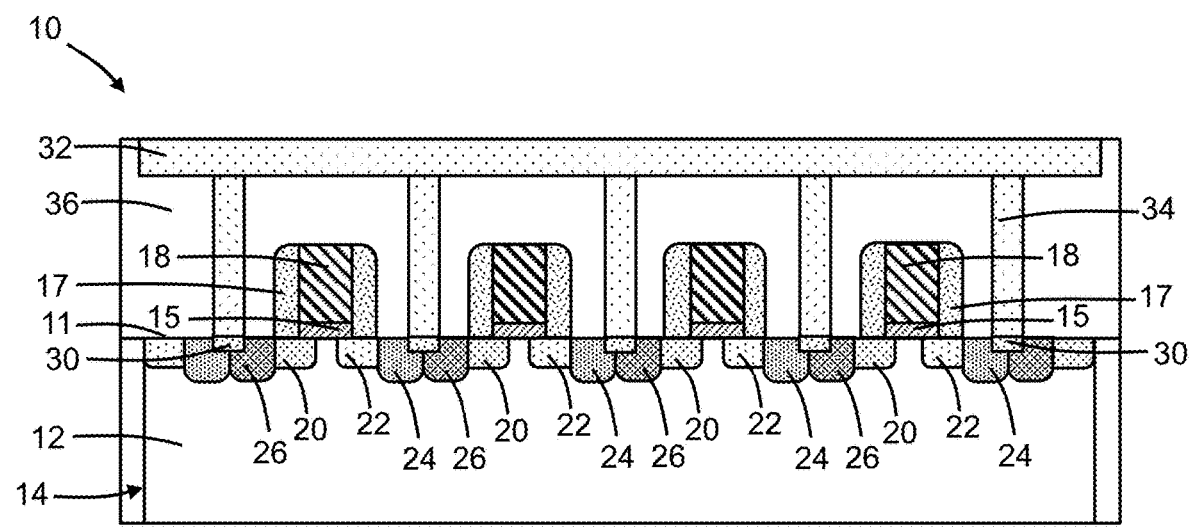

With reference to FIG. 4 in which like reference numerals refer to like features in FIG. 3 and at a subsequent fabrication stage of the processing method, sections of a silicide layer 30 are formed over each of the abutted pairs of the doped regions 24, 26. The silicide layer 30 may be formed by a silicidation process in which a layer of a silicide-forming metal is deposited by, for example, chemical vapor deposition or physical vapor deposition on the doped regions 24, 26 followed by one or more annealing processes (e.g., rapid thermal annealing). During annealing, a silicide phase formed by reacting the layer of silicide-forming metal and the contacted semiconductor material of the doped regions 24, 26. Candidate materials for the silicide-forming metal include, but are not limited to, nickel, titanium, cobalt, palladium, platinum, or other metals capable of reacting with silicon to form a low-resistivity, thermally-stable silicide. Residual silicide-forming metal remaining after forming the silicide layer 30 may be removed by wet chemical etching.

The layer of silicide-forming metal may be patterned by lithography and etching processes, prior to silicidation, such that the silicide layer 30 includes sections of given dimensions that are arranged over the doped regions 24, 26 and, more specifically, over the p-n junctions between the doped regions 24, 26. Due to the restriction placed on the dimensions of the layer of silicide-forming metal through patterning, the sections of the silicide layer 30 are laterally spaced and separated from the doped regions 20, 22 such that the doped regions 20, 22 are not shorted to the doped regions 24, 26. In that regard, each section of the silicide layer 30 is positioned on an area at the top surface 11 that is smaller than an area of the doped regions 24, 26 at the top surface 11.

Source lines 32 and contacts 34 are formed in an interlayer dielectric layer 36. The contacts 34 connect each source line 32 to the different sections of the silicide layer 30 and, therefore, to the different pairs of doped regions 24, 26 in each of the active regions 12, 13. The contacts 34 may be composed of a metal, such as tungsten, the source line 32 may composed of a metal, such as copper, tungsten, or cobalt, and the interlayer dielectric layer 36 may be composed of a dielectric material, such as silicon dioxide. In the representative embodiment, a single source line 32 is connected to the doped regions 24, 26 associated with each of the active regions 12, 13.

To program the structure 10, a combination of a positive voltage applied to the source line 32 and ground applied to the gate electrodes 18 (which function as word lines for both active regions 12, 13) will cause a breakdown of the gate dielectric layer 15 located over the doped regions 20. Breakdown results from a current flowing from the doped regions 26 through the doped regions 20 and gate dielectric layers 15 to the gate electrodes 18. A combination of ground applied to the source line 32 and a positive voltage applied to the gate electrodes 18 will cause a breakdown of the gate dielectric layers 15 located over the doped regions 22. Breakdown results from a current flowing from the gate electrodes 18 through the doped regions 22 and gate dielectric layers 15 to the doped regions 24.

The gate dielectric layers 15 in each of the active regions 12, 13 may be separately programmed by applying a programming voltage to the source line 32 associated with the active region 12 or to the source line 32 associated with the active region 13. After programming, the gate dielectric layers 15 in one or both active regions 12, 13 may include one or more conductive filaments that function to reduce the electric resistance of the gate dielectric layers 15 and provide a low-resistance state. The programming may be erased by applying a combination of voltages to the source line 32 and gate electrodes 18 that eliminates the one or more conductive filaments and thereby restores the gate dielectric layers 15 to their high-resistance state. The programmed state may be read by applying a different combination of voltages (e.g., ground and one-half of the programming voltage) to the source line 32 and gate electrodes 18.

The structure 10 provides a compact device structure that may be fabricated in a complementary metal-oxide-semiconductor (CMOS) process with either no additional masks or, at most, a single additional mask. If the gate dielectric layers 15 are composed of silicon dioxide, the structure 10 may provide a one-time-programmable non-volatile memory element. If the gate dielectric layers 15 are composed of a high-k dielectric material, the structure 10 may provide a multiple-time-programmable non-volatile memory element.

Figure 5:
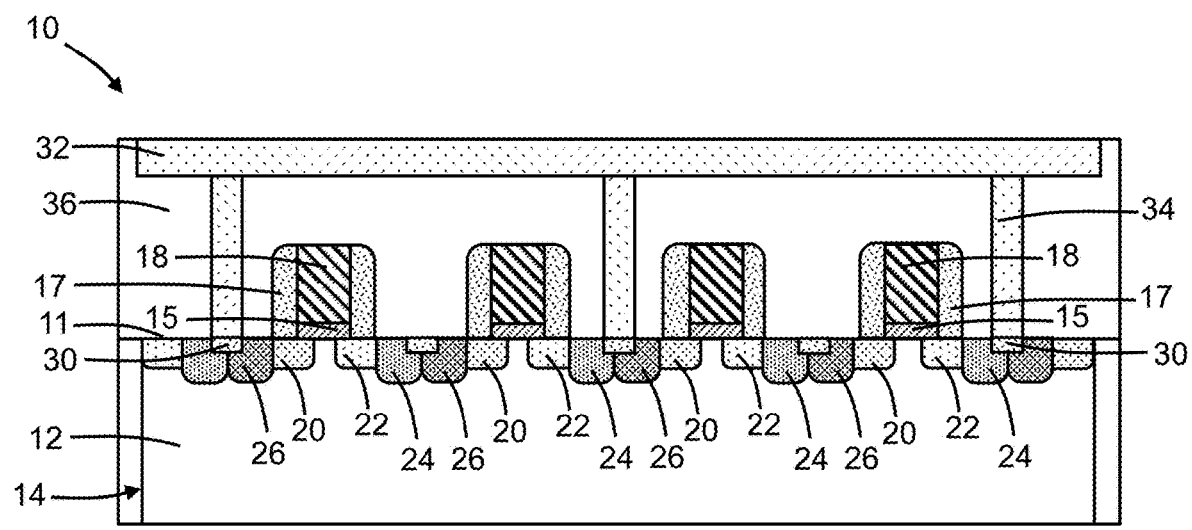
FIGS. 5, 6 are cross-sectional views each similar to FIG. 4 of a non-volatile memory structure in accordance with alternative embodiments of the invention.
Figure 6:
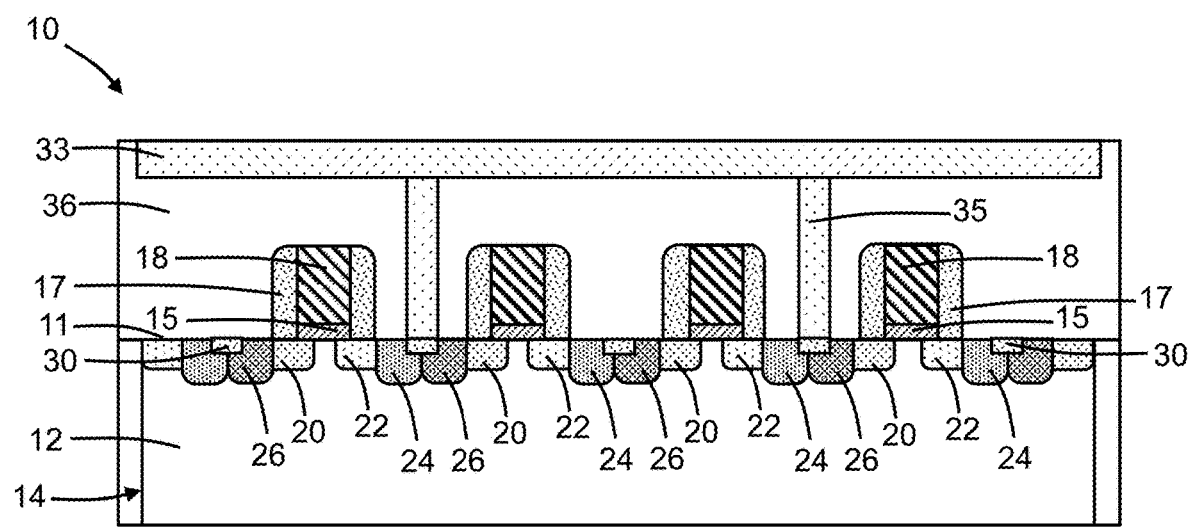

With reference to FIGS. 5, 6 in which like reference numerals refer to like features in FIG. 4 and in accordance with alternative embodiments, another source line 33 and associated contacts 35 may be formed in the interlayer dielectric layer 36 over each of the active regions 12, 13. The contacts 34 connect the source line 32 to some of the sections of the silicide layer 30 on the abutted doped regions 24, 26 and, therefore, to only some of the doped regions 24, 26 in each active region 12, 13. The contacts 35 also connect the source line 33 to some of the sections of the silicide layer 30 and, therefore, to only some of the doped regions 24, 26 in each active region 12, 13. The connections to the different source lines 32, 33 may alternate across the width of each active region 12, 13.

The addition of the additional source line 33 and the concomitant change to the connections with the doped regions 24, 26 modifies the structure 10 to have an arrangement characteristic of a bistable resistor (i.e., biristor). The sources lines 32, 33 may be separately controlled in order to program the structure 10. The structure 10 may be programmed by applying a positive voltage to one or the other of the source lines 32, 33 and grounding the gate electrodes 18 to cause the breakdown of the gate dielectric layers 15 over one or the other of the doped regions 20, 22. Alternatively, the structure 10 may be programmed by applying a positive voltage to the gate electrodes 18 and grounding one or the other the source lines 32, 33 to also cause the breakdown of the gate dielectric layer 15 over one or the other of the doped regions 20, 22.

Figure 7:
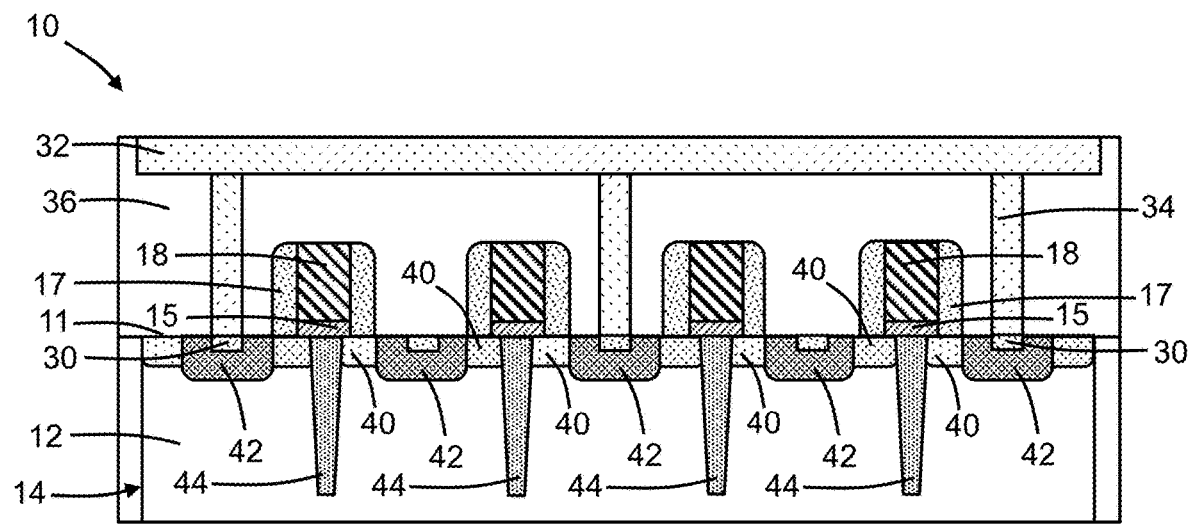
FIGS. 7, 8 are cross-sectional views similar to FIGS. 5, 6 of a non-volatile memory structure in accordance with alternative embodiments of the invention.
Figure 8:
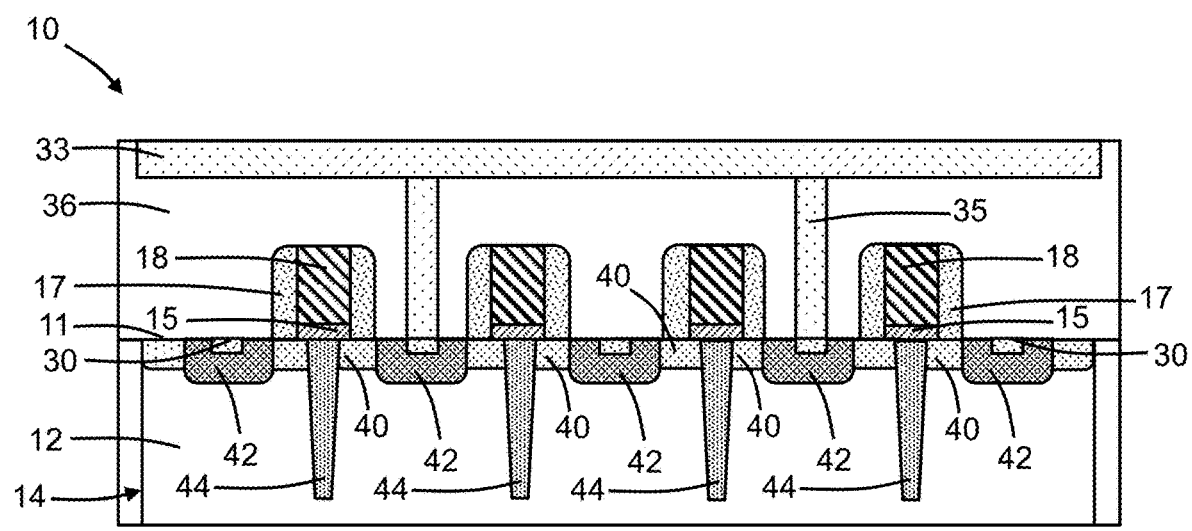

With reference to FIGS. 7, 8 in which like reference numerals refer to like features in FIGS. 5, 6 and in accordance with alternative embodiments, the structure 10 may be formed with doped regions 40 and doped regions 42 that are doped to have opposite conductivity types. In an embodiment, the doped regions 40 may have the doping and conductivity type of doped regions 20, and the doped regions 42 may have the doping and conductivity type of doped regions 26. In another embodiment, the doped regions 40 may have the doping and conductivity type of doped regions 22, and the doped regions 42 may have the doping and conductivity type of doped regions 24. The sections of the silicide layer 30 are formed only on the doped regions 42 with restricted dimensions as previously discussed.

Shallow trench isolation regions 44 may also be added to the structure 10. The shallow trench isolation regions 44 are formed in trenches that extend from a top surface of the substrate 14 to a shallow depth into the substrate 14. The shallow trench isolation regions 44 may be composed of a dielectric material, such as silicon dioxide, deposited by chemical vapor deposition into trenches patterned by lithography and etching processes in the substrate 14 at appropriate locations. The shallow trench isolation regions 44 are located in the substrate 14 beneath the gate electrodes 18 in a vertical direction and are located in the substrate 14 laterally between adjacent pairs of the doped regions 40. In an embodiment, only one shallow trench isolation region 44 is located beneath each gate electrode 18. In an embodiment, each shallow trench isolation region 44 may be located beneath one of the gate electrodes 18 with a substantially centered arrangement. The shallow trench isolation regions 44 may extend across each of the active regions 12, 13 from one of the shallow trench isolation regions 16 to an opposite one of the shallow trench isolation regions 16 such that the sets of doped regions 40, 42 are compartmentalized with one of the doped regions 42 positioned between a pair of doped regions 40. The shallow trench isolation regions 44 may function to reduce device leakage.

Figure 9:
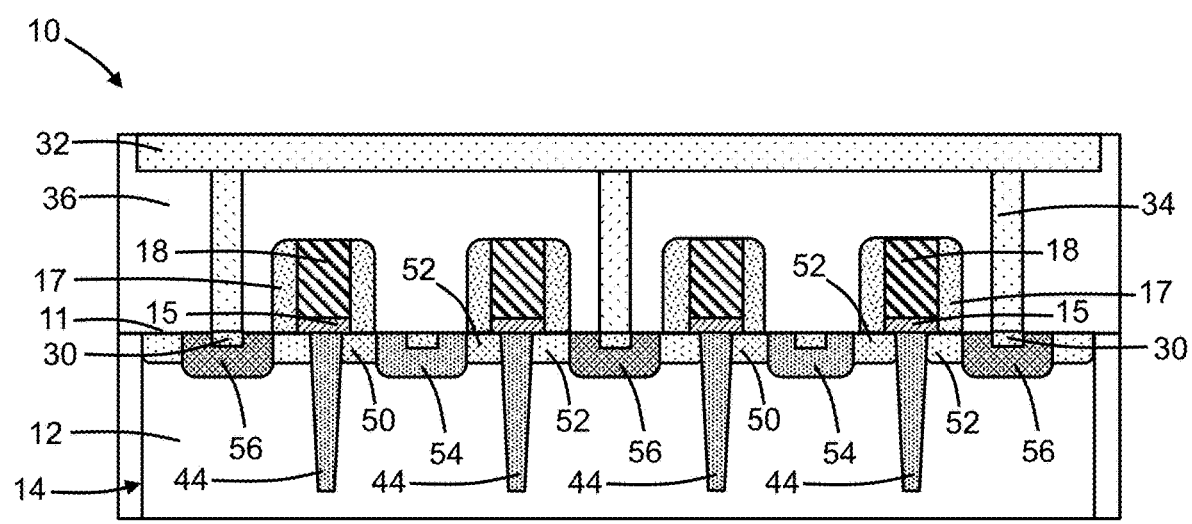
FIG. 9 is a cross-sectional view similar to FIG. 4 of a non-volatile memory structure in accordance with alternative embodiments of the invention.

With reference to FIG. 9 in which like reference numerals refer to like features in FIG. 4 and in accordance with alternative embodiments, the structure 10 may be formed with doped regions 50, doped regions 52, doped regions 54, and doped regions 56 in which the doped regions 50 and 54 have one conductivity type and the doped regions 52 and 56 have the opposite conductivity type. In an embodiment, the doped regions 50 may have the doping and conductivity type of doped regions 20, the doped regions 52 may have the doping and conductivity type of doped regions 22, the doped regions 54 may have the doping and conductivity type of doped regions 24, the doped regions 56 may have the doping and conductivity type of doped regions 26. As previously described, the sections of the silicide layer 30 are formed only on the doped regions 54, 56 and are size restricted to avoid shorting to the doped regions 50, 52.

One of the doped regions 56 is associated with a pair of the doped regions 50 in one type of doped region combination. One of the doped regions 54 is associated with a pair of the doped regions 52 in another type of doped region combination. The different doped region combinations alternate across the width of each of the active regions 12, 13. The shallow trench isolation regions 44 may be located in the substrate 14 beneath the gate electrodes 18.

The structure 10 only includes the source line 32 that is associated with each of the active regions 12, 13. A positive voltage applied to the source line 32 and ground applied to the gate electrodes 18 will result in breakdown of the gate dielectric layers 15 over the doped regions 50 but not breakdown of the gate dielectric layers 15 over the doped regions 52. Ground applied to the source line 32 and a positive voltage applied to the gate electrodes 18 will result in breakdown of the gate dielectric layers 15 over the doped regions 52 but not breakdown of the gate dielectric layers 15 over the doped regions 50.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a non-volatile memory element, the structure comprising:
    a semiconductor substrate including an active region;
    a first word line over the active region;
    a second word line over the active region, the second word line adjacent to and laterally spaced from the first word line;
    a first gate dielectric layer between the first word line and the active region;
    a second gate dielectric layer between the second word line and the active region;
    a first shallow trench isolation region in the active region, the first shallow trench isolation region positioned beneath the first word line;
    a first doped region in the active region, the first doped region positioned at least in part beneath the first word line, and the first doped region having a first conductivity type;
    a second doped region in the active region, the second doped region positioned adjacent to the first doped region and within an area between the first word line and the second word line, and the second doped region having a second conductivity type opposite to the first conductivity type;
    a third doped region in the active region, the third doped region positioned at least in part beneath the first word line; and
    a first source line coupled to the second doped region,
    wherein the first shallow trench isolation region is positioned laterally between the second doped region and the third doped region.

2. The structure of claim 1 wherein the first gate dielectric layer comprises silicon dioxide.

3. The structure of claim 1 wherein the first gate dielectric layer comprises a high-k dielectric material.

4. The structure of claim 1 wherein the first doped region and the second doped region are contiguous.

5. The structure of claim 1 further comprising:
a silicide layer having a section on the second doped region, the section of the silicide layer laterally spaced from the first doped region.

6. The structure of claim 5 wherein the first source line is coupled to the second doped region by the silicide layer.

7. The structure of claim 1 wherein the third doped region has the first conductivity type.

8. The structure of claim 1 wherein the third doped region has the second conductivity type.

9. The structure of claim 1 wherein the first doped region is laterally positioned between the second doped region and the first shallow trench isolation region.

10. The structure of claim 1 further comprising:
a second shallow trench isolation region in the active region, the second shallow trench isolation region positioned beneath the second word line,
wherein the second doped region is positioned laterally between the first shallow trench isolation region and the second shallow trench isolation region.

11. A structure for a non-volatile memory element, the structure comprising:
a semiconductor substrate including an active region;
a first word line over the active region;
a second word line over the active region, the second word line adjacent to and laterally spaced from the first word line;
a first gate dielectric layer between the first word line and the active region;
a second gate dielectric layer between the second word line and the active region;
a shallow trench isolation region in the active region, the shallow trench isolation region positioned beneath the first word line;
a first doped region in the active region, the first doped region positioned at least in part beneath the first word line, and the first doped region having a first conductivity type;
a second doped region in the active region, the second doped region positioned adjacent to the first doped region and within an area between the first word line and the second word line, and the second doped region having a second conductivity type opposite to the first conductivity type;
a third doped region in the active region, the third doped region positioned at least in part beneath the first word line, and the third doped region having the first conductivity type;
a fourth doped region in the active region, the fourth doped region positioned adjacent to the third doped region, and the fourth doped region having the second conductivity type; and
a first source line coupled to the second doped region, wherein the first doped region and the third doped region are laterally positioned between the second doped region and the fourth doped region, and the shallow trench isolation region is laterally positioned between the first doped region and the third doped region.

12. The structure of claim 11 further comprising:
a second source line coupled to the fourth doped region.

13. The structure of claim 11 wherein the first gate dielectric layer comprises silicon dioxide.

14. The structure of claim 11 wherein the first gate dielectric layer comprises a high-k dielectric material.

15. The structure of claim 11 further comprising:
a silicide layer having a section on the second doped region, the section of the silicide layer laterally spaced from the first doped region.

16. The structure of claim 15 wherein the first source line is coupled to the second doped region by the silicide layer.

17. A method of forming a structure for a non-volatile memory element, the method comprising:
forming a first gate dielectric layer over an active region of a semiconductor substrate;
forming a first word line over the first gate dielectric layer;
forming a gate dielectric layer over the active region of the semiconductor substrate;
forming a second word line over the gate dielectric layer, wherein the second word line is positioned adjacent to and laterally spaced from the first word line;
forming a shallow trench isolation region in the active region, wherein the shallow trench isolation region is positioned beneath the first word line;
forming a first doped region in the active region that is positioned at least in part beneath the first word line;
forming a second doped region in the active region that is positioned adjacent to the first doped region and within an area between the first word line and the second word line;
forming a third doped region in the active region that is positioned at least in part beneath the first word line; and
forming a source line coupled to the second doped region,
wherein the shallow trench isolation region is positioned laterally between the second doped region and the third doped region, the first doped region has a first conductivity type, and the second doped region has a second conductivity type opposite to the first conductivity type.

18. The method of claim 17 further comprising:
forming a silicide layer having a section on the second doped region,
wherein the section of the silicide layer is laterally spaced from the first doped region.

19. The method of claim 18 wherein the source line is coupled to the second doped region by the silicide layer.

20. The method of claim 18 wherein forming the silicide layer having the section on the second doped region comprises:
depositing a layer of a silicide-forming metal on the second doped region;
patterning the layer to form a section of the layer of the silicide-forming metal on the second doped region; and
reacting the section of the layer of the silicide-forming metal and contacted semiconductor material of the second doped region to form the section of the silicide layer.

* * * * *